(12) United States Patent
Baike

(10) Patent No.: US 10,230,032 B2
(45) Date of Patent: Mar. 12, 2019

(54) METHOD OF MANUFACTURING LIGHT EMITTING DEVICE

(71) Applicant: NICHIA CORPORATION, Anan-shi (JP)

(72) Inventor: Ikuko Baike, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 35 days.

(21) Appl. No.: 15/660,965

(22) Filed: Jul. 27, 2017

(65) Prior Publication Data

US 2018/0033929 A1 Feb. 1, 2018

(30) Foreign Application Priority Data

Jul. 28, 2016 (JP) .................................. 2016-148663

(51) Int. Cl.
| | |
|---|---|
| *H01L 33/60* | (2010.01) |
| *H01L 33/48* | (2010.01) |
| *H01L 33/00* | (2010.01) |
| *H01L 33/50* | (2010.01) |
| *H01L 33/62* | (2010.01) |
| *H01L 25/075* | (2006.01) |
| *H01L 33/56* | (2010.01) |

(52) U.S. Cl.
CPC .......... *H01L 33/60* (2013.01); *H01L 25/0753* (2013.01); *H01L 33/005* (2013.01); *H01L 33/0079* (2013.01); *H01L 33/483* (2013.01); *H01L 33/502* (2013.01); *H01L 33/62* (2013.01); *H01L 33/0095* (2013.01); *H01L 33/486* (2013.01); *H01L 33/505* (2013.01); *H01L 33/56* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(58) Field of Classification Search
CPC ... H01L 33/60; H01L 33/0079; H01L 33/486; H01L 33/483; H01L 33/005; H01L 33/46; H01L 25/0753
See application file for complete search history.

(56) References Cited

U.S. PATENT DOCUMENTS

| | | | | |
|---|---|---|---|---|
| 2004/0041220 | A1* | 3/2004 | Kwak | ................... H01L 33/508 257/432 |
| 2009/0267085 | A1* | 10/2009 | Lee | .......................... F21K 9/00 257/88 |

(Continued)

FOREIGN PATENT DOCUMENTS

| | | |
|---|---|---|
| JP | 2008-277409 | 11/2008 |
| JP | 2010-103186 | 5/2010 |

(Continued)

*Primary Examiner* — Joseph C. Nicely
(74) *Attorney, Agent, or Firm* — Mori & Ward, LLP

(57) ABSTRACT

A method of manufacturing a light emitting device, includes mounting, on a support substrate, an element set that includes a plurality of light emitting elements on an element substrate. A light reflecting member is provided between the element set and the support substrate. The element substrate is removed from the plurality of light emitting elements. The support substrate and the light reflecting member is cut between the plurality of light emitting elements so as to singulate a plurality of light emitting devices.

7 Claims, 8 Drawing Sheets

(56) References Cited

U.S. PATENT DOCUMENTS

| | | | | |
|---|---|---|---|---|
| 2010/0320479 A1* | 12/2010 | Minato | ............... | H01L 33/505 257/88 |
| 2015/0001574 A1* | 1/2015 | Baike | ................ | H01L 33/20 257/99 |
| 2015/0295152 A1* | 10/2015 | Yoneda | ............. | H01L 33/0095 257/98 |
| 2016/0095184 A1* | 3/2016 | Nakabayashi | ........ | H05B 33/22 313/503 |

FOREIGN PATENT DOCUMENTS

| | | |
|---|---|---|
| JP | 2014-107307 | 6/2014 |
| JP | 2014-225588 | 12/2014 |

* cited by examiner

METHOD OF MANUFACTURING LIGHT EMITTING DEVICE

CROSS-REFERENCE TO RELATED APPLICATIONS

The present application claims priority under 35 U.S.C. § 119 to Japanese Patent Application No. 2016-148,663, filed on Jul. 28, 2016. The contents of this application are incorporated herein by reference in their entirety.

BACKGROUND

1. Technical Field

The present disclosure relates to a method of manufacturing a light emitting device.

2. Description of Related Art

A light emitting device is known, with a structure of which a white-color covering member is provided around a semiconductor light emitting element (for example, see JP 2014-107307 A).

There is a need for further simplification of manufacturing a light emitting device having such the structure.

SUMMARY

A method of manufacturing a light emitting device, includes mounting, on a support substrate, an element set that includes a plurality of light emitting elements on an element substrate. A light reflecting member is provided between the element set and the support substrate. The element substrate is removed from the plurality of light emitting elements. The support substrate and the light reflecting member is cut between the plurality of light emitting elements so as to singulate a plurality of light emitting devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1A:
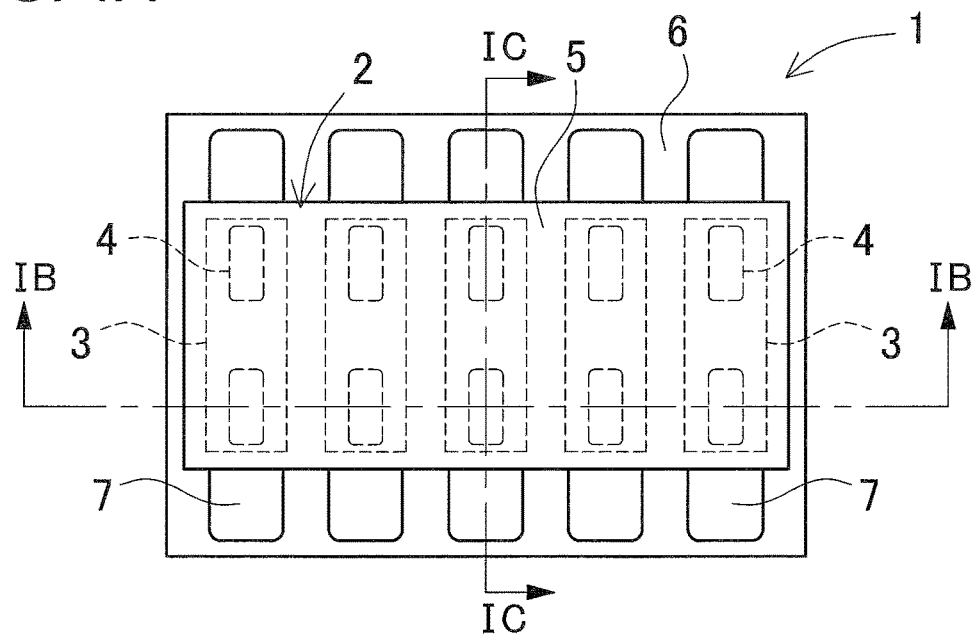
FIG. 1A is a plan view showing a state where an element set of an embodiment according to the present invention is flip-chip mounted.

The embodiments will now be described with reference to the accompanying drawings, wherein like reference numerals designate corresponding or identical elements throughout the various drawings.

In the following, a description will be given of an embodiment of the present invention with reference to the drawings as appropriate. Note that, a method of manufacturing a light emitting device described in the following is for embodying the technical idea of the present disclosure. Unless otherwise specified, the present disclosure is not specified to the following. Further, the description provided in one embodiment or example is applicable to other embodiment or example. The size or positional relationship of members in the drawings may be exaggerated for the sake of clarity.

A method of manufacturing a light emitting device according to an embodiment includes, in sequence: mounting, on an element mounting surface of a support substrate, an element set that includes a plurality of light emitting elements on one element substrate; providing a light reflecting member between the element set and the support substrate; removing the element substrate from the plurality of light emitting elements; and cleaving the support substrate and the light reflecting member between the plurality of light emitting elements, so as to singulate the plurality of light emitting devices.

Figure 1B:
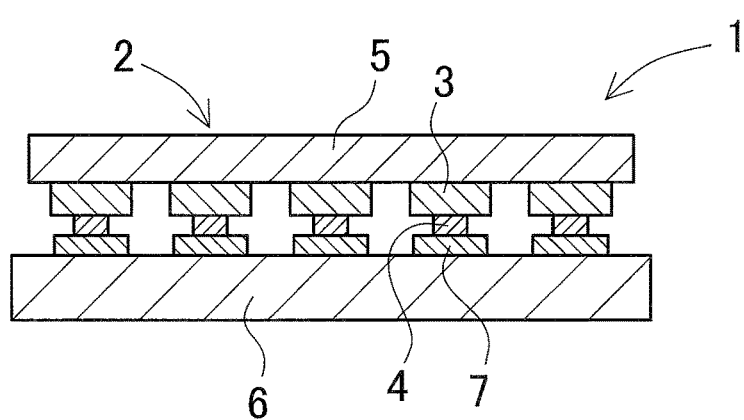
FIG. 1B is a longitudinal-sectional view showing IB-IB line in FIG. 1A.
Figure 1C:
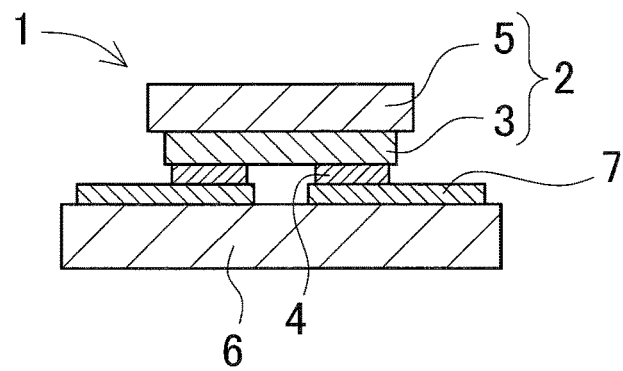
FIG. 1C is a cross-sectional view showing IC-IC line in FIG. 1A.

FIGS. 1A to 1C each show a state where an element set 2, which includes a plurality of light emitting elements 3 on one element substrate 5, is mounted on a support substrate 6. FIG. 1A is a top view. FIG. 1B is a section view taken along line IB-IB in FIG. 1A. FIG. 1C is a section view taken along line IC-IC in FIG. 1A.

FIG. 1A shows a state where an element set including five light emitting elements 2 on one element substrate 5 is mounted on a support substrate 6. The light emitting elements 3 each have a pair of p-electrode and n-electrode, which are respectively bonded to conductive members 7 of the support substrate 6 via bonding members.

Figure 2A:
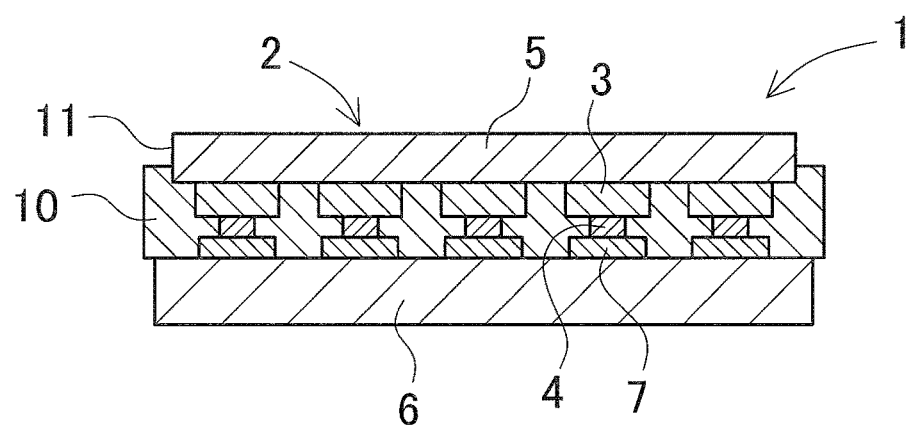
FIG. 2A is a longitudinal-sectional view showing a state where space between an element substrate and a support substrate is filled with a light reflecting member.
Figure 2B:
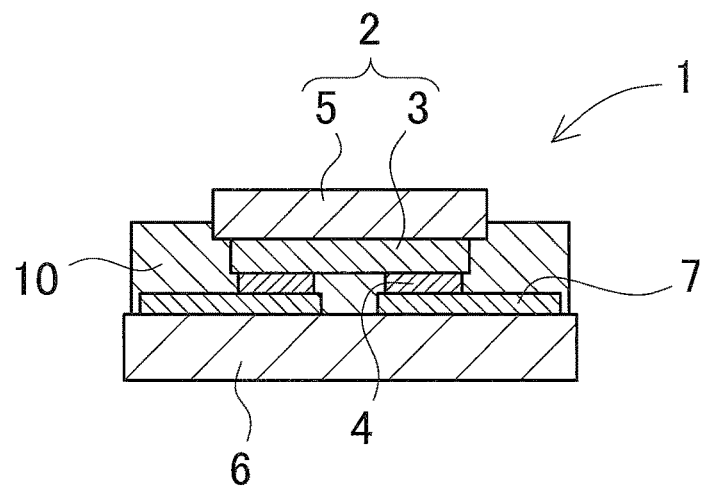
FIG. 2B is a cross-sectional view showing a state where space between an element substrate and a support substrate is filled with a light reflecting member.

Next, as shown in FIGS. 2A to 2B, space is filled with a light reflecting member 10. FIG. 2A is a longitudinal section view showing a state where space is filled with the light reflecting member 10. FIG. 2B is a cross section view of such a state. The light reflecting member 10 is formed by potting, transfer molding, compression molding or the like.

The light reflecting member 10 is formed between the support substrate 6 and the element substrate 5, and so as to cover the lateral surface of each light emitting element. In more detail, the light reflecting member 10 is preferably disposed so as to cover the lateral surface of the semiconductor layer of each light emitting element 3, and in contact with the semiconductor layer so as to entirely surround the semiconductor layer. Thus, in the state where the element substrate 5 is removed, leakage of light from the lateral surface of the semiconductor layer is prevented, whereby light can efficiently be emitted from the upper surface of the semiconductor layer.

Further, the light reflecting member 10 preferably fills up the space so as to cover a lower portion of an outer peripheral surface 11 of the element substrate 5. Thus, the light reflecting member 10 can be formed so that the upper surface of the light reflecting member 10 becomes flush with the upper surface of the semiconductor layer of each light emitting element 3 when the element substrate 5 is removed.

Further, the light reflecting member 10 is preferably provided so as to fill up the space between each mounted light emitting element 3 and the support substrate 6. This structure enhances the strength of the light emitting device 1. Note that, the light reflecting member 10 disposed between each light emitting element 3 and the support substrate 6 may be made of a material different from a material that covers the lateral surface of the semiconductor layer of each light emitting element 3. Thus, the light reflecting member disposed at the lateral surface of the semiconductor layer and the light reflecting member disposed between the light emitting element 3 and the support substrate 6 can respectively be provided with proper functions. For example, the light reflecting member disposed at the lateral surface of the semiconductor layer may be made of a material that exhibits high reflectivity, while the light reflecting member disposed between the light emitting element 3 and the support substrate 6 may be made of a material that secures adhesion between the light emitting element 3 and the support substrate 6. In order to obtain this structure, for example, two types of light reflecting members differing in the content of a light reflecting material may be employed. Defining the light reflecting member being smaller in the content of the light reflecting material as a first light reflecting member and the light reflecting member being greater in the content of the light reflecting material as a second light reflecting member, by disposing the second light reflecting member between the light emitting element and the support substrate 6 and thereafter disposing the second light reflecting member at the lateral surface of each light emitting element, the light reflecting member structured by two light reflecting members is obtained.

Figure 3A:
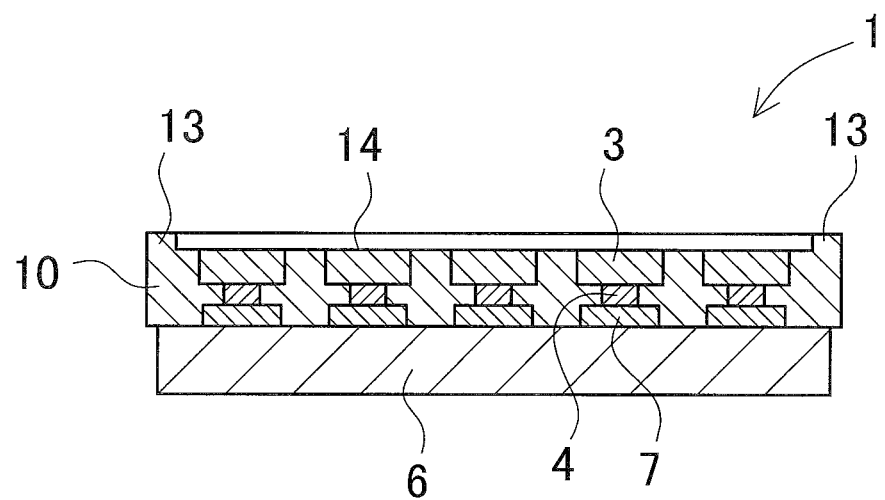
FIG. 3A is a longitudinal-sectional view showing a state where the element substrate has been removed.
Figure 3B:
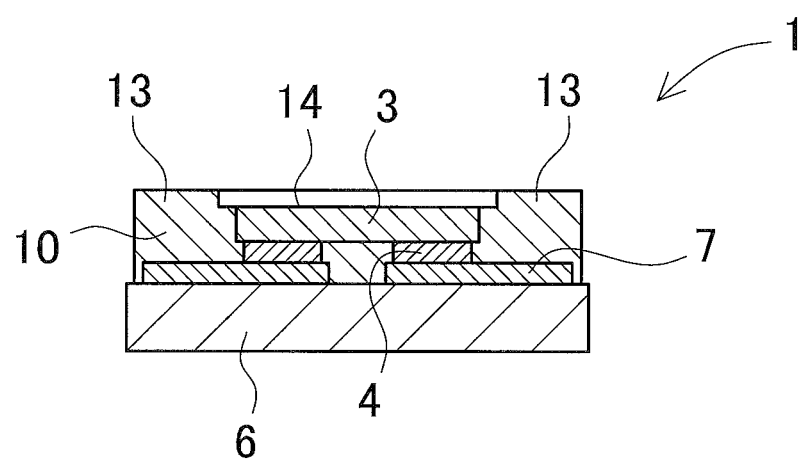
FIG. 3B is a cross-sectional view showing a state where the element substrate has been removed.

Next, as shown in FIGS. 3A and 3B, the element substrate 5 for growing the semiconductor layer having supported the semiconductor layer is removed. FIG. 3A is a longitudinal section view showing the state after the removal of the element substrate 5, and FIG. 3B is a cross section view showing such a state. The element substrate 5 can be removed by, for example, laser lift-off which includes operations of: irradiating the semiconductor layer from the element substrate 5 side with laser light that transmits through the element substrate 5 (for example, KrF excimer laser), so as to cause a decomposition reaction at the interface between the semiconductor layer and the element substrate 5; and removing the element substrate 5 from the semiconductor layer.

Figure 4A:
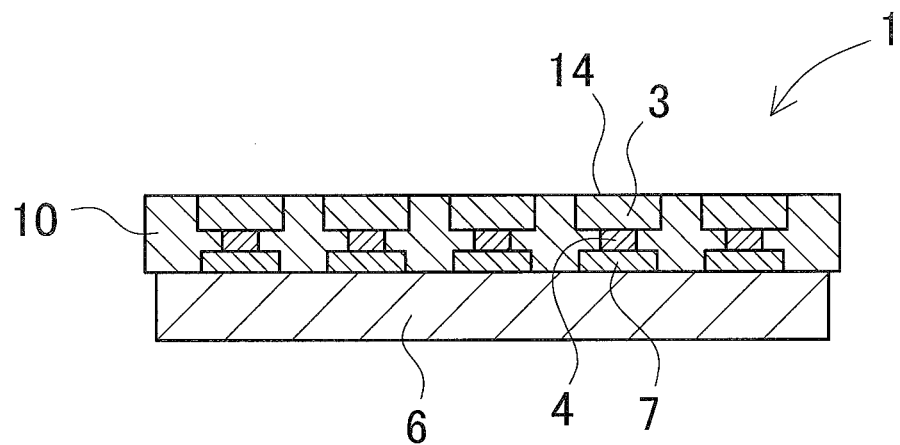
FIG. 4A is a longitudinal-sectional view showing a state where a projection remained on the periphery of the light reflecting member has been removed.
Figure 4B:
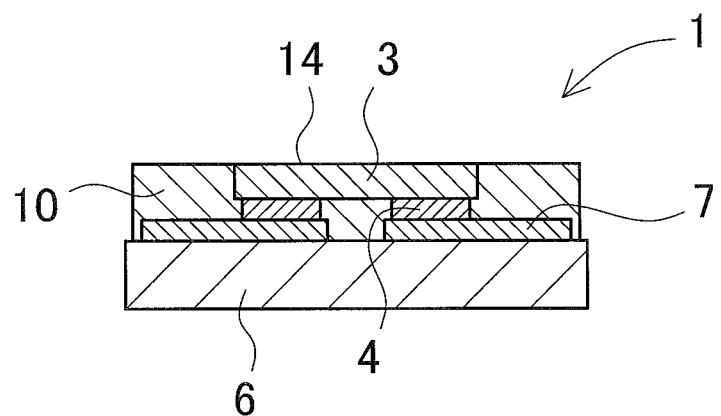
FIG. 4B is a cross-sectional view showing a state where a projection remained on the periphery of the light reflecting member has been removed.

When the element substrate 5 is removed, the light reflecting member 10 which had been covering a lower portion of the outer peripheral surface 11 of the element substrate 5 may leave a projection 13 along the periphery of the formed light reflecting member 10. In such a case, the projection 13 is for example covered with a metal mask provided with an opening, and removed by blast grinding. FIG. 4A is a longitudinal section view of the state after the removing the projection 13. FIG. 4B is a cross section view of such a state.

Figure 5A:
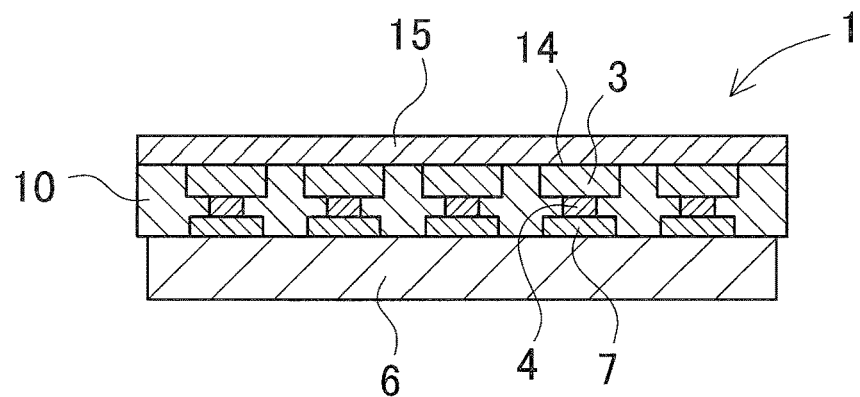
FIG. 5A is a longitudinal-sectional view showing a state where a wavelength conversion layer is formed.
Figure 5B:
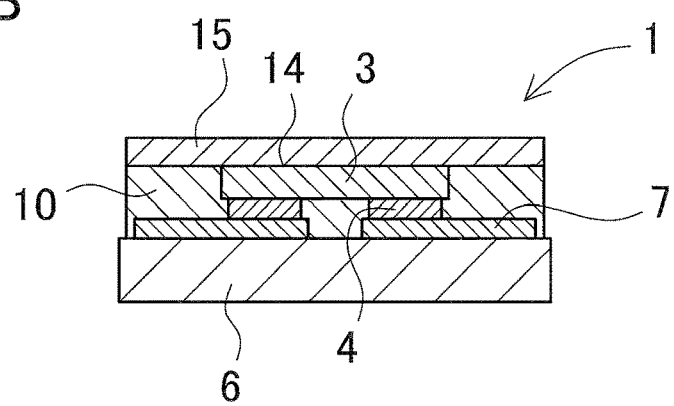
FIG. 5B is a cross-sectional view showing a state where a wavelength conversion layer is formed.

In the state where the element substrate 5 is removed, the upper surface 14 of the semiconductor layer of each light emitting element 3 and the upper surface of the light reflecting member 10 are flush with each other, with no light reflecting member 10 attaching to the upper surface 14 of the semiconductor layer. Accordingly, a wavelength conversion layer 15 can be formed without an operation of removing any light reflecting member 10 attached to the upper surface 14 of the semiconductor layer. In order to adjust viscosity or flowability, silica (AEROSIL) or the like may be added to the wavelength conversion layer 15. The wavelength conversion layer 15 is desirably formed by spraying, particularly by a pulsed splaying scheme in which a material is intermittently sprayed. By the intermittent spraying, the wavelength conversion layer 15 can be evenly applied by a smaller injection amount. FIG. 5A is a longitudinal section view showing the state where the wavelength conversion layer 15 is formed. FIG. 5B is a cross section view of such a state.

Figure 6:
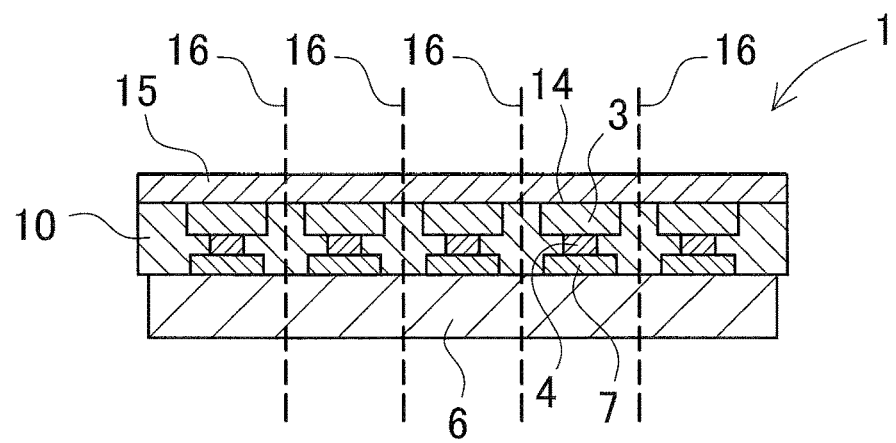
FIG. 6 is a longitudinal-sectional view showing cleaving positions where light emitting elements and the support substrates are cleaved.
Figure 7A:
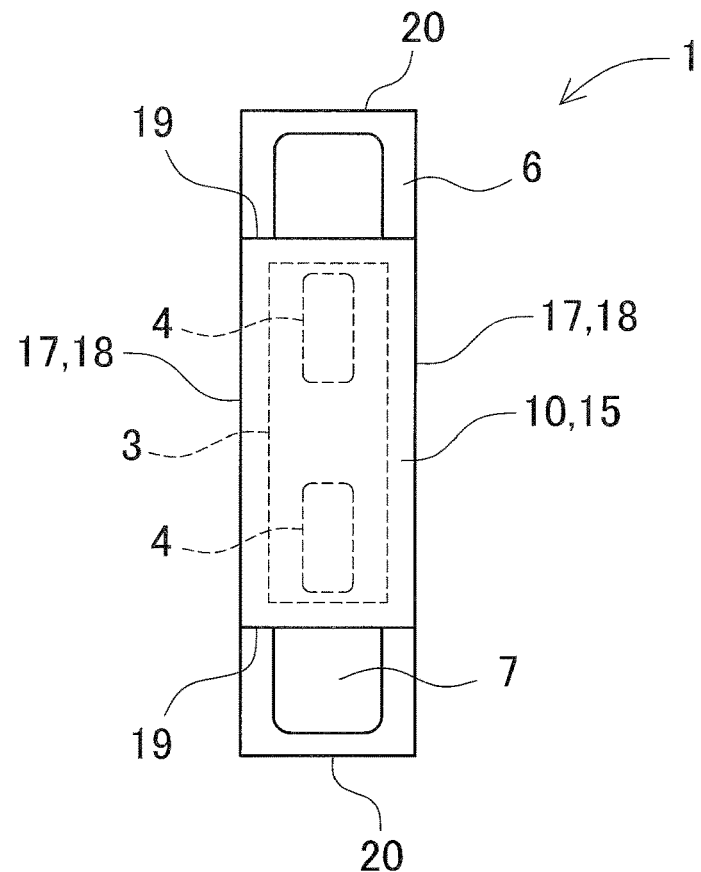
FIG. 7A is a plan view of the cleaved light emitting device.
Figure 7B:
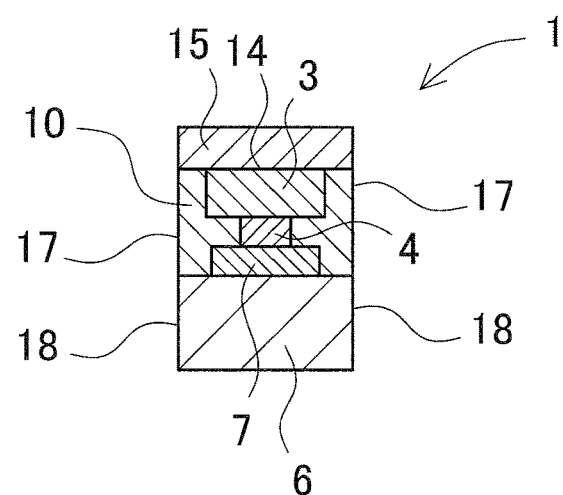
FIG. 7B is a cross-sectional view of the cleaved light emitting device.

Thereafter, along broken lines 16 shown in FIG. 6, the light emitting elements 3 and the support substrate 6 are collectively cleaved. FIG. 7A is a plan view of the cleaved light emitting device 1. FIG. 7B is a cross section view thereof.

One edge 17 in the long-side direction of the light reflecting member 10 of the cleaved light emitting device 1 preferably conforms to an edge 18 in the long-side direction of the support substrate 6. That is, at least one of the end surfaces in the long-side direction of the light reflecting member 10 preferably forms an identical surface with one of the end surfaces in the long-side direction of the support substrate 6, and more preferably both the end surfaces of the light reflecting member 10 respectively form identical surfaces with both the end surfaces of the support substrate 6. This structure allows the light reflecting member 10 to form the outer surface of the light emitting device 1. This increases the area of the light extraction surface without increasing the exterior thickness of the light emitting device 1, and thus improves the light extraction efficiency. While each edge 19 in the short-side direction may be disposed outer than each edge 20 in the short-side direction of the support substrate 6, normally, the edge 19 forms an identical surface with the edge 20 of the support substrate 6, or disposed inner than the edge 20. As used herein, an identical surface is not only used just in a strict sense. When the light reflecting member 10 is somewhat rounded, the curvature at any point should conform to the end surface of the support substrate 6.

In the state where the support substrate 6 is cleaved, the light reflecting member 10 as seen from the light extraction surface side is greater in plane area than the light emitting element 3. In particular, the length in the long-side direction of the outermost shape of the light reflecting member 10 is preferably about 1.0 to 4.0 times as great as one side of the light emitting element 3. Specifically, the length is preferably in a range of about 300 μm to 2000 μm, and more preferably about 1000 μm to 1500 μm. The thickness of the light reflecting member 10 (the width from the end surface of the light emitting element 3 to the outermost shape of the light reflecting member 10 as seen from the light extraction surface side, which is also referred to as the minimum width of the light reflecting member 10 at the lateral surface of the light emitting element 3) is, for example, in a range of about 0 µm to 1000 µm, and preferably about 50 µm to 500 µm and about 100 µm to 200 µm.

Figure 8A:
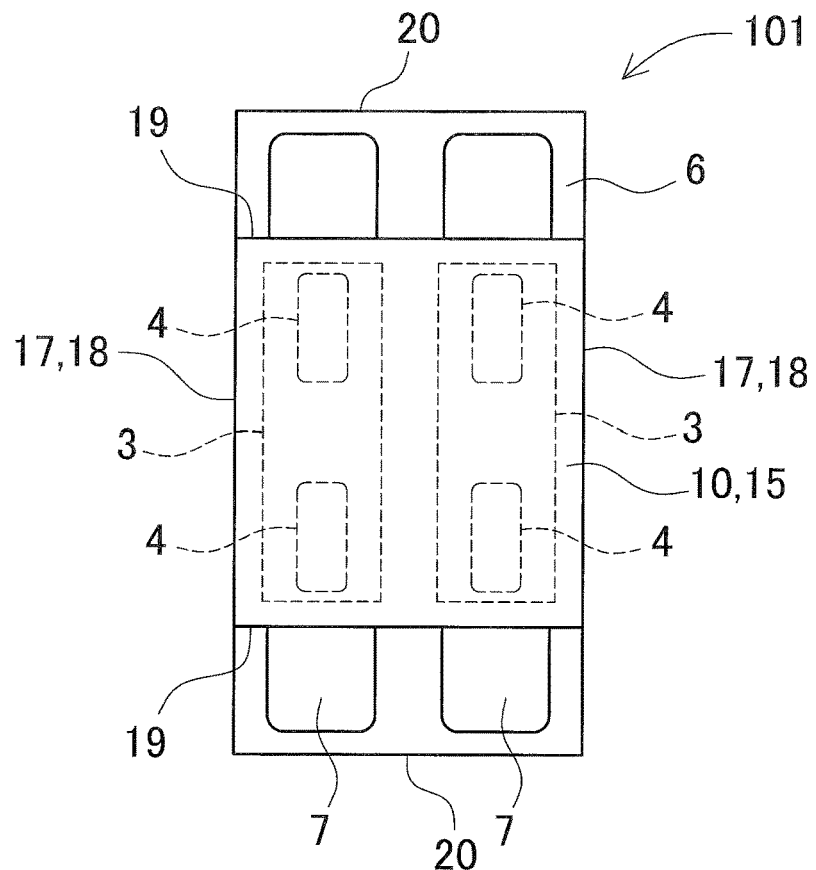
FIG. 8A is a plan view of the cleaved light emitting device.
Figure 8B:
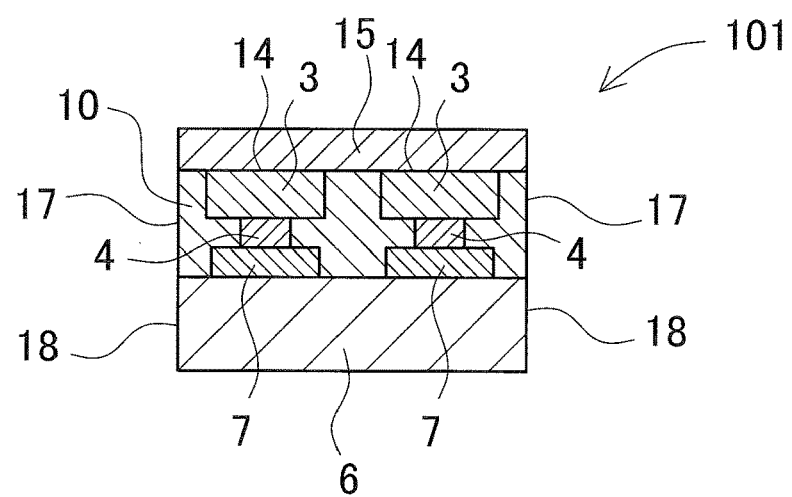
FIG. 8B is a cross-sectional view of the cleaved light emitting device.

Note that, while the light emitting device 1 shown in FIGS. 7A and 7B includes one light emitting element 3, it goes without saying that the number of the light emitting element 3 is not particularly specified. The light emitting device 1 may include two or more light emitting elements 3. FIG. 8A is a plan view of a light emitting device 101 that includes two light emitting elements 3. FIG. 8B is a cross section view of the light emitting device 101.

Figure 9:
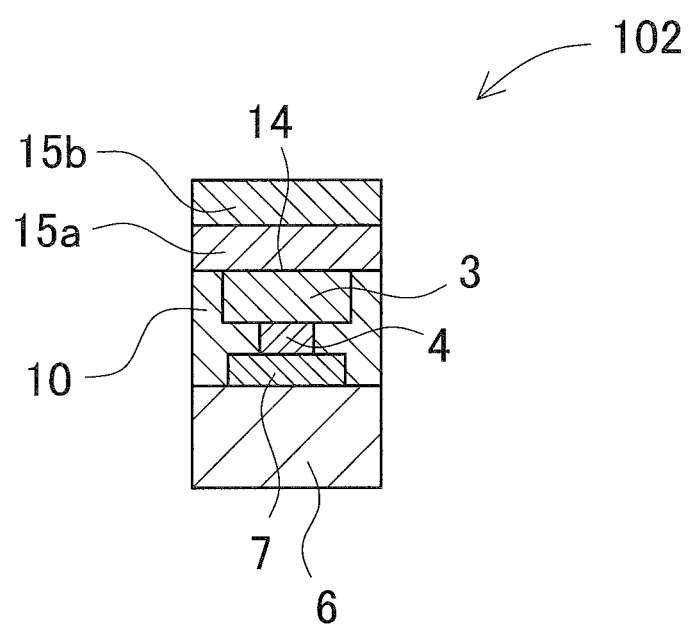
FIG. 9 is a cross-sectional view showing a light emitting device in which two wavelength conversion layers are formed.

A light emitting device 102 shown in FIG. 9 includes a first wavelength conversion layer 15a, and a second wavelength conversion layer 15b that covers the first wavelength conversion layer 15a. By the second wavelength conversion layer 15b covering the first wavelength conversion layer 15a, a first fluorescent material contained in the first wavelength conversion layer 15a is protected, and thus becomes less prone to deteriorate. As a result, the first fluorescent material can fully exhibit its function. Thus, the light emitting device 101 being reliable and long in life can be manufactured. Further, the second wavelength conversion layer shown in FIG. 9 may be a light-transmissive resin member that contains no fluorescent material. This structure protects the first fluorescent material contained in the first wavelength conversion layer.

In the following, a description will be given of each element.

Support Substrate

The support substrate includes an insulating base material, and conductive members that function as a pair of positive and negative electrodes.

Base Material

The shape, size, thickness and the like of the base material in one light emitting device are not particularly specified, and can be set as appropriate. While it depends on the material of the base material, and the type and structure of the light emitting element mounted thereon, the thickness of the base material is, for example, preferably about 470 µm or smaller, more preferably about 370 µm or smaller, about 320 µm or smaller, about 270 µm or smaller, and more preferably about 200 µm, 150 µm, 100 µm or smaller. Further, in view of strength and the like, the thickness is preferably about 20 µm or greater. In order to reliably obtain the strength of the entire support substrate, the flexural strength of the base material is preferably equivalent to the strength of the support substrate stated above, for example, about 300 MPa or greater, and more preferably about 400 MPa or greater, and about 600 MPa or greater.

The planar shape of the base material is, for example, a circle, a polygon such as a quadrangle, or any shape similar to the foregoing shapes. Among others, the planar shape of the base material is preferably a rectangle, that is, a shape being elongated in the long-side direction. The base material is preferably greater in plane area than the light emitting element, which will be described later. In the case where one light emitting element 3 is mounted on one light emitting device, the length in the long-side direction of the light emitting device is preferably about 1.5 to 5 times, more preferably about 1.5 to 3 times, as great as one side of the light emitting element 3. Further, the length in the short-side direction of the light emitting device is preferably about 1.0 to 2.0 times, more preferably about 1.1 to 1.5 times, as great as one side of the light emitting element. In the case where a plurality of light emitting elements 3 is mounted on one light emitting device, the length can be adjusted as appropriate in accordance with the number. For example, in the case where two or three light emitting elements 3 are mounted in the long-side direction, the length in the long-side direction of the light emitting device is preferably about 2.4 to 6.0 times or about 3.5 to 7.0 times as great as one side of the light emitting element.

As to the strength of the support substrate, in the thickness range stated above, preferably the flexural strength is 300 MPa or greater, more preferably 400 MPa or greater, and further preferably 600 MPa or greater. Here, the flexural strength refers to the measurement value obtained by the 3-point flex test with a commercially available strength tester, for example a tester available from Instron.

The base material structuring the support substrate may be any material, so long as the linear expansion coefficient thereof falls within a range of ±10 ppm/° C. as great as the linear expansion coefficient of the light emitting element. Preferably, the linear expansion coefficient falls within a range of ±9 ppm/° C., +8 ppm/° C., +7 ppm/° C., or +5 ppm/° C. Note that, in the present embodiment, the linear expansion coefficient refers to the value measured by the TMA scheme. At least one of, preferably both of, α1 and α2 should satisfy the value.

The base material may be, for example, metal, ceramic, resin, dielectric, pulp, glass, paper, or a composite material of the foregoing materials (e.g., a composite resin), or a composite material of any of the foregoing materials and a conductive material (e.g., metal, carbon, or the like). The metal may be copper, iron, nickel, chromium, aluminum, silver, gold, titanium, or alloy containing any of the foregoing metals. The ceramic may be aluminum oxide, aluminum nitride, zirconium oxide, zirconium nitride, titanium oxide, titanium nitride, or a mixture of any of the foregoing material. The composite resin may be glass epoxy resin or the like.

In particular, the base material suitably contains resin. The resin may be any resin so long as it is used in the field of the art. Specifically, the resin may be epoxy resin, bismaleimide-triazine (BT) resin, polyimide resin, cyanate resin, polyvinyl acetal resin, phenoxy resin, acrylic resin, alkyd resin, urethane resin or the like.

Whatever the type, the resin preferably exhibits a glass-transition temperature of, for example, about 250° C. or greater, and more preferably, about 270° C. or greater, about 280° C. or greater, about 300° C. or greater, about 320° C. or greater. Note that, the glass-transition temperature may be measured by any of, for example, a method of measuring a change in mechanical property, heat absorption, or heat generation while gradually raising or lowering the temperature of a sample (TMA, DSC, DTA or the like), and a method of measuring a response from a dynamic viscoelasticity test sample while changing the frequency of cyclic force applied to the sample.

Whatever the type, in order for the resin to have a linear expansion coefficient of ±10 ppm/° C. as great as the linear expansion coefficient of the light emitting element, or to increase the thermal emissivity, the resin preferably contains filler, for example, an inorganic material as filler. Combining the type, amount and the like of such filler as appropriate, the linear expansion coefficient of the base material can be adjusted.

The filler and the inorganic material may be, for example, borate particles coated with hexagonal boron nitride, alumina, silicas (natural silica, molten silica and the like), metal hydrate (aluminum hydroxide, boehmite, magnesium hydroxide and the like), molybdenum compounds (molybdenum oxide and the like), zinc borate, zinc stannate, aluminum oxide, clay, kaolin, magnesium oxide, aluminum nitride, silicon nitride, talc, calcined clay, calcined kaolin, calcined talc, mica, glass short fibers (glass fine powders such as E glass, D glass, glass cloth and the like), heat-shrinkable filler such as hollow glass fibers, zirconium phosphate and the like, styrene-based rubber powder, butadiene-based rubber powder, acryl-based rubber powder, silicone rubber powder and the like, and core-shell type rubber powder (styrene-based rubber powder, butadiene-based rubber powder, acryl-based rubber powder, silicone rubber powder and the like) or the like. In particular, allowing resin to contain, by a great amount, filler or an inorganic material that exhibits high thermal conductivity, the thermal emissivity can be adjusted. For example, with glass cloth, an inorganic material can be contained in the glass cloth by 50 wt % or greater, by 70 wt % or greater, and by 90 wt % or greater.

Further, the resin may contain pigment. The pigment may be carbon black, titanium oxide or the like.

Conductive Members

A pair of conductive members should be formed at least at the upper surface of the support substrate (on the side where the light emitting element is mounted). In this case, at least part of the edge of each conductive member is preferably formed so as to conform to part of the edge of the upper surface of the support substrate. In other words, preferably part of the end surface of each conductive member and the mounting surface of the support substrate are formed to become an identical surface. Thus, in mounting the light emitting device on a mounting substrate, the mounting substrate and the end surface of the conductive member can be brought into contact with each other (or brought in extreme proximity to each other). Thus, the mountability of the light emitting device improves. As used herein, the identical surface means that any height difference does not exist or little exists, and irregular shapes of about several micrometers to ten-odd micrometers are tolerated. In the present specification, the term identical surface is used in this sense in the following.

Each conductive member has an element connected portion that is connected to an electrode of the light emitting element at the upper surface of the support substrate, and an externally connected portion that is connected to an external element outside the light emitting device. In addition to the upper surface of the support substrate, preferably the externally connected portion is also provided at the lower surface of the support substrate. For example, preferably the conductive member is: (i) provided so as to extend from the upper surface to the lateral surface; (ii) provided so as to extend from the upper surface to the lower surface through a via or a through hole provided to penetrate through the base material; or (iii) provided so as to extend from the upper surface to the lower surface via the lateral surface (for example, to be U-shaped as seen in a section view).

The support substrate may include, in addition to the conductive members that function as electrodes, a conductive member that is not electrically connected to the light emitting element and functions as, for example, a heat dissipation member, a reinforce member and the like.

Further, in the case where a plurality of light emitting elements is disposed in one light emitting device, one or more additional conductive members that electrically connect the plurality of light emitting elements 3 may be included.

Each conductive member may be formed by, for example, a single-layer film or a multilayer film of metal such as Au, Pt, Pd, Rh, Ni, W, Mo, Cr, Ti, Fe, Cu, Al, Ag or the like, or alloy of the foregoing metals. Among others, metal or alloy that exhibits excellent conductivity and mountability is preferable. Metal or alloy that exhibits excellent bondability and wettability with solder on the mounted side is more preferable. In particular, in view of heat dissipation property, copper or copper alloy is preferable. At the surface of each conductive member, highly light-reflecting coating of silver, platinum, tin, gold, rhodium, or alloy of foregoing metals may be formed. Each conductive member may specifically have a layered structure such as: W/Ni/Au, W/Ni/Pd/Au; W/NiCo/Pd/Au; Cu/Ni/Cu/Ni/Pd/Au; Cu/Ni/Pd/Au, Cu/Ni/Au, Cu/Ni/Ag; Cu/Ni/Au/Ag and the like. Further, each conductive member may be partially varied in thickness or in the number of layers.

Element Set

In view of productivity, as the element substrate, it is preferable to employ a substrate for growing a semiconductor layered body of the light emitting element, which will be described later. Such a substrate may be an insulating substrate such as sapphire ($Al_2O_3$) or spinel ($MgAl_2O_4$), or a nitride-based semiconductor substrate. The thickness of the element substrate is, for example, preferably about 190 μm or smaller, and more preferably about 180 μm or smaller, about 150 μm or smaller.

The element substrate may have a plurality of projections or irregular shapes on its surface. In accordance therewith, for example, on the element substrate-side surface of the nitride semiconductor layered body formed on the plurality of projections or irregular shapes (the surface opposite to the surface where the electrodes of the nitride semiconductor layered body is formed), a plurality of projections or irregular shapes corresponding to the shape of the element substrate may be formed. Thus, the irregular shapes may have a height in a range of about 0.5 μm to 2.0 μm, and a pitch in a range of about 10 μm to 25 μm. The element substrate may have a miscut angle in a range of about 0° to 10° relative to a predetermined crystal face such as the C-plane or the A-plane. Note that, the element substrate may have, between the element substrate and the first semiconductor layer, a semiconductor layer, an insulating layer or the like, as an intermediate layer, a buffer layer, a base layer and the like.

After the element set and the support substrate are bonded to each other and the light reflecting member is provided between them, the element substrate is removed. The element substrate can be removed by, for example, laser lift-off which includes operations of: irradiating the semiconductor layer from the element substrate side with laser light that transmits through the element substrate and is absorbed by the semiconductor layer (for example, when the element substrate is sapphire and the semiconductor layer is GaN-based, KrF excimer laser), so as to cause the semiconductor layer to decompose at the interface between the semiconductor layer and the element substrate; and removing the element substrate from the semiconductor layer.

The removing the element substrate provides the light emitting device being smaller in size with a reduced thickness. Further, the removing the element that does not directly contribute to light emission prevents light emitted from the light emitting layer from being absorbed by such an element. Further, it also reduces light scattering attributed to the light emitting element substrate. Thus, increased light emission efficiency and/or increased light emission luminance is/are achieved.

Light Emitting Element

The size, shape, and light emission wavelength of the light emitting element can be selected as appropriate. When a plurality of light emitting elements is mounted, they should be arranged regularly or cyclically, such as in a matrix. Further, a plurality of light emitting elements may be connected to each other in series, in parallel, in series-parallel, or in parallel-series.

The light emitting element includes at least the semiconductor layered body. The semiconductor layered body includes, in sequence, an n-type semiconductor layer, a light emitting layer, and a p-type semiconductor layer, and contributes to light emission. The thickness of the semiconductor layered body is preferably about 30 μm or smaller, more preferably about 15 μm or smaller, about 10 μm or smaller. Further, the semiconductor layered body is provided with a pair of positive and negative electrodes at its identical surface.

The type and material of the semiconductor layer are not specifically specified. For example, the semiconductor layer may be made of various types of semiconductors such as a group III-V compound semiconductor and a group II-VI compound semiconductor. Specifically, a nitride semiconductor such as $In_XAl_YGa_{1-X-Y}N$ ($0 \leq X$, $0 \leq Y$, $X+Y \leq 1$) may be employed, and InN, AlN, GaN, InGaN, AlGaN, InGaAlN and the like may be used. The thickness and the structure of the layers may be any of those known in the art.

While the shape of the light emitting element or the semiconductor layered body as seen in a plan view is not particularly specified, preferably it is a quadrangle or a shape similar to a quadrangle. The upper limit of the size can be adjusted as appropriate depending on the size of the light emitting device or the characteristics demanded of the light emitting device. For example, the length of one side of the semiconductor layered body may be in a range of about several hundred micrometers to two millimeters. Specifically, the length of one side of the semiconductor layered body may be about 1400 μm×200 μm, about 1100 μm×200 μm, about 900 μm×200 μm.

Electrodes

A pair of electrodes is formed on an identical surface side of the semiconductor layered body. This realizes flip-chip mounting in which the wiring electrodes of the support substrate and the electrodes of the light emitting element are bonded to each other as being opposed to each other.

The electrodes may each be formed by, for example, a single-layer film or a multilayer film of metal such as Au, Pt, Pd, Rh, Ni, W, Mo, Cr, Ti or the like, or alloy of the foregoing metals. Specifically, the electrodes may each be formed by a multilayer film which includes, in sequence from the semiconductor layer side, Ti/Rh/Au, W/Pt/Au, Rh/Pt/Au, W/Pt/Au, Ni/Pt/Au, Ti/Rh or the like.

Light Reflecting Member

The light reflecting member is provided between the element set, which includes a plurality of light emitting elements provided on one element substrate, and the support substrate. The light reflecting member is provided at least around the light emitting elements. The material thereof is not particularly specified, and may be ceramic, resin, dielectric, pulp, glass, or a composite material of the foregoing materials. Among others, resin is preferable for its moldability into any shape.

The resin may be thermosetting resin, thermoplastic resin or the like. Specifically, epoxy resin, silicone resin, and modified epoxy resin such as silicone-modified epoxy resin, modified silicone resin such as epoxy-modified silicone resin, hybrid silicone resin, polyimide resin, modified polyimide resin, polyphthalamide (PPA) resin, polyamide (PA) resin, polycarbonate resin, polyphenylenesulfide (PPS) resin, liquid crystal polymer (LCP) resin, ABS resin, phenolic resin, acrylic resin, PBT resin or the like may be employed.

The light reflecting member is preferably a light shielding material that exhibits a reflectivity of 60% or greater, more preferably 70%, 80%, or 90% or greater, to light emitted by the light emitting element. Therefore, it is preferable to cause any of the above-stated materials, for example, resin, to contain a light reflecting material, a light scattering material or a coloring material, or a thermally emissive member, such as titanium dioxide, silicon dioxide, zirconium dioxide, potassium titanate, alumina, aluminum nitride, boron nitride, mullite, niobium oxide, barium sulfate, various kinds of rare-earth oxides (e.g., yttrium oxide, gadolinium oxide). The light reflecting member may contain fibrous filler such as glass fibers or wollastonite, or inorganic filler such as carbon. Further, a material that exhibits high heat dissipation property (e.g., aluminum nitride or the like) may be contained. These additives are preferably contained by, for example, in a range of about 10 wt % to 95 wt %, about 20 wt % to 80 wt %, about 30 wt % to 60 wt %, to the total weight of the sealing member.

By causing the light reflecting member to contain a light reflecting material, light emitted by the light emitting element can be efficiently reflected. In particular, using a material being higher in light reflectivity than the support substrate (for example, using silicone resin containing titanium dioxide as the light reflecting member when aluminum nitride is used as the support substrate), light extraction efficiency of the light emitting device can be enhanced with the support substrate being reduced in size and its handleability being maintained. In the case where just titanium dioxide is contained as the light reflecting material, titanium dioxide is contained preferably by, in a range of about 20 wt % to 60 wt %, further preferably by about 30 wt % to 50 wt % to the total weight of the light reflecting member.

The light reflecting member is preferably disposed so as to surround the lateral surface of the light emitting element, and in contact with the light emitting element so as to entirely surround the light emitting element. Thus, leakage of light from the lateral surface of the light emitting element is prevented, whereby light can efficiently be emitted from the upper surface of the light emitting element. Further, light not having its wavelength converted becomes less prone to leak from the lateral surface of the light emitting element, whereby the light emitting device with reduced color non-uniformity is provided.

Further, the light reflecting member is preferably provided so as to fill up the space between the flip-chip mounted light emitting element and the support substrate. This enhances the strength of the light emitting device. Further, the light reflecting member disposed between the light emitting element and the support substrate may be a material being different from the material that covers the lateral surface of the light emitting element. Thus, the light reflecting member disposed at the lateral surface of the light emitting element and the light reflecting member disposed between the light emitting element and the support substrate can respectively be provided with proper functions. For example, the light reflecting member disposed at the lateral surface of the light emitting element may be made of a material that exhibits high reflectivity, while the light reflecting member disposed between the light emitting element and the support substrate may be made of a material that secures adhesion between the light emitting element and the support substrate.

The edge of the sealing member as seen in a plan view (a plan view as seen from the light extraction surface side) may be disposed inner than or outer than the edge of the support substrate. Further, the edge may be rounded in the long-side direction or in the direction perpendicular thereto.

Wavelength Conversion Layer

After the light reflecting member is provided between the element set and the support substrate, in the state where the element substrate is removed from the light emitting element, the wavelength conversion layer that converts the wavelength of light emitted from the light emitting element is formed at least at the upper surface of the light emitting element.

The wavelength conversion layer may be a layer that is formed just by a fluorescent material that converts the wavelength of light emitted by the light emitting element. Alternatively, for example, the wavelength conversion layer may be made of a light-transmissive material containing a fluorescent material.

Any fluorescent material may be used so long as it is at least excited by light emitted by the light emitting element and emits light of different wavelength. For example, the fluorescent material may be (1) an aluminum-garnet-based fluorescent material (e.g., a cerium-activated yttrium-aluminum-garnet (YAG)-based fluorescent material, a cerium-activated lutetium-aluminum-garnet (LAG)-based fluorescent material or the like), (2) a europium and/or chromium-activated nitrogen-containing calcium aluminosilicate ($CaO-Al_2O_3-SiO_2$)-based fluorescent material, (3) a europium-activated silicate (($Sr,Ba)_2SiO_4$)-based fluorescent material, (4) an s-SiAlON-based fluorescent material, (5) a CASN ($CaAlSiN_3$:Eu)-based or a SCASN-based nitride-based fluorescent material, (6) a $LnSi_3N_{11}$-based or LnSiAlON-based rare-earth nitride-based fluorescent material (Ln is a rare-earth element), (7) a $BaSi_2O_2N_2$:Eu-based, $Ba_3Si_6O_{12}N_2$:Eu-based oxynitride-based fluorescent material, (8) a $Mn^{4+}$-activated fluoride complex fluorescent material (e.g., a KSF ($K_2SiF_6$:Mn)-based fluorescent material), (9) a CaS-based (CaS:Eu), $SrGa_2S_4$-based ($SrGa_2S_4$:Eu), $SrAl_2O_4$-based, ZnS-based sulfide-based fluorescent material, (10) a chlorosilicate-based fluorescent material and the like.

Further, the fluorescent material may be a light emitting substance in a form of highly dispersed particles of nano-size, i.e., what is called a nanocrystal or quantum dots (Q-Dots), of a semiconductor material such as a group II-VI, a group III-V, or a group IV-VI semiconductor, specifically, CdSe, core-shell type $CdS_xSe_{1-x}$/ZnS, or GaP. Since a quantum dot fluorescent material is unstable, the surface of the particles may be coated or stabilized with PMMA (polymethyl methacrylate), silicone resin, epoxy resin, or hybrid resin of the foregoing resins.

Such a structure provides a light emitting device that emits mixed-color light (e.g., white-based color) being mixture of primary light of a visible wavelength emitted by the light emitting element and secondary light being the primary light having undergone wavelength conversion by the fluorescent material contained in the wavelength conversion layer, and a light emitting device that emits secondary light of a visible wavelength by being excited by primary light of ultraviolet rays. In the case where the light emitting device is used for backlight of a liquid crystal display or the like, it is preferable to employ a fluorescent material that is excited by blue-color light and emits red-color light (e.g., a KSF-based fluorescent material) and a fluorescent material that is excited by blue-color light and emits green-color light (e.g., a β-sialon fluorescent material). This increases the color reproduction range of a display using the light emitting device. When the light emitting device is used as illumination or the like, a light emitting element that emits blue-color light, a fluorescent material that emits yellow-color light, a fluorescent material that emits red-color light, and a light emitting element or a fluorescent material that emits blue-green-color light may be used in combination.

The shape of the particles of the fluorescent material may be, for example, crushed, spherical, hollow, porous or the like. Preferably, the fluorescent material has an average particle size (median size) of 50 µm or smaller, 30 µm or smaller, 20 µm or smaller, or 10 µm or smaller. The average particle size can be measured or calculated by processing images that are obtained with commercially available particle counter, particle size distribution analyzer, or SEM. The above-noted average particle size refers to the particle size obtained by the air-permeability principle in F.S.S.S.No (Fisher Sub Sieve Sizer's No).

The light-transmissive material in which the fluorescent material is contained may be, for example, highly light-transmissive silicone resin, silicone-modified resin, epoxy resin, phenolic resin, polycarbonate resin, acrylic resin, TPX resin, polynorbornene resin, hybrid resin that contains at least one of the foregoing resins, glass or the like.

The wavelength conversion layer may be provided as a plurality of layers. The plurality of layers may contain an identical fluorescent material, or may respectively contain fluorescent materials differing in type, concentration, composition or the like.

In particular, the wavelength conversion layer may at least have a first wavelength conversion layer that is formed at the upper surface of the light emitting element, that is, on the light extraction surface of the light emitting device, and a second wavelength conversion layer that covers the first wavelength conversion layer and contains a fluorescent material being of the type differing from that of the first wavelength conversion layer.

The second fluorescent material contained in the second fluorescent material layer is preferably greater in weather resistance than the first fluorescent material contained in the first fluorescent material layer. Particularly, the second fluorescent material is preferably higher in waterproofness, shorter in light emission wavelength, and less prone to deteriorate than the first fluorescent material.

Thus, the first fluorescent material being smaller in weather resistance is protected and becomes less prone to deteriorate. As a result, the first fluorescent material is allowed to fully exhibit its function. Thus, a highly reliable and long-life light emitting device is manufactured.

In the present specification, the light emission wavelength of the fluorescent material refers to the peak wavelength. In general, with an identical excitation wavelength, the fluorescent material generates greater heat in wavelength conversion with a greater light emission wavelength. Accordingly, when the light emission wavelength of the second fluorescent material is shorter than the light emission wavelength of the first fluorescent material, that is, when the light emission wavelength of the first fluorescent material is greater than the light emission wavelength of the second fluorescent material, heat generated at the first fluorescent material tends to become greater. Here, disposing the first fluorescent material layer at a position in close proximity to other member such as the light emitting device or the support substrate, dissipation of the heat from the first fluorescent material is facilitated.

Note that, the term waterproofness refers to resistance to a phenomenon in which the property of the fluorescent material changes due to a change in the original compound state of the base member of the fluorescent material by the base member being dissolved, decomposed, deliquesced, or chemically reacted due to water or moisture. Hence, being high in waterproofness means that the degree of a change in property as the fluorescent material is small.

The light-transmissive material can be selected as appropriate from the above-noted resins that structure the light shielding member. The materials that have functions of filling, light diffusion, and coloring can be selected as appropriate from the above-noted additives having been exemplarily shown as to the base material and the light shielding member.

In particular, the light-transmissive material that structures the second fluorescent material layer is preferably a material being lower in gas barrier property and vapor transmissivity than the material of the first fluorescent material layer. Thus, the first fluorescent material in the first fluorescent material layer can be effectively protected. Further, the light-transmissive material that structures the first fluorescent material layer is preferably better in heat dissipation property and greater in thermal conductivity than the second fluorescent material layer. This structure improves the reliability of the light emitting device. Further, the refractive index of the light-transmissive material that structures the first fluorescent material layer is preferably equal to or greater than that of the light-transmissive material that structures the second fluorescent material layer. Thus, light is effectively extracted from the fluorescent material layer, whereby light extraction efficiency of the light emitting device improves.

The fluorescent material such as the above-noted nanocrystal, quantum dots or the like has, for example, a particle size of 1 nm to 100 nm (including atoms of about 10 to 50 in number). Use of such a fluorescent material reduces the inner scattering. With reduced light inner scattering, components of light that are distributed in the direction perpendicular to the upper surface increase. At the same time, light directed to the lateral or lower surface of the light emitting device reduces. As a result, a further improvement in light extraction efficiency is achieved. For example, when the embodiment of the present invention is applied to backlight, efficiency of light entering into the backlight further increases. Such a fluorescent material referred to as a nanocrystal or quantum dots is generally prone to deteriorate due to moisture or gas outside the light emitting device, and therefore is preferably used as the first fluorescent material.

The first fluorescent material may be, representatively, a fluorescent material selected from a group consisting of a KSF-based fluorescent material, a CaS-based fluorescent material, a $SrGa_2S_4$-based fluorescent material, a $SrAl_2O_4$-based fluorescent material, a CASN-based fluorescent material, and Q-dots. The second fluorescent material may be a fluorescent material selected from a group consisting of an aluminum-garnet-based fluorescent material, a β-SiAlON-based fluorescent material, and a chlorosilicate-based fluorescent material.

Further, preferably the average particle size of the first fluorescent material is about 50 μm or smaller, while the average particle size of the second fluorescent material is about 30 μm or smaller. The average particle size of the first fluorescent material is greater than that of the second fluorescent material. In other words, a combination of the first and second fluorescent materials in which the second fluorescent material is smaller in average particle size than the first fluorescent material is preferable. Thus, light being the secondary light emitted by the first fluorescent material is less prone to be blocked by the second fluorescent material.

The wavelength conversion layer may be formed by, for example, a method including operations of: depositing the fluorescent material by potting or electrophoretic deposition; and thereafter impregnating the fluorescent material with a light-transmissive material. Alternatively, the wavelength conversion layer may be formed by compression molding, electrostatic coating, printing, bonding a sheet-like first fluorescent material or the like. Here, in the case where the material of the first wavelength conversion layer is liquid, such as in potting, compression molding, printing or the like, a viscosity adjusting agent (e.g., fine particles of silica) may be added for adjusting viscosity or flowability. Among others, it is preferable to form the wavelength conversion layer by potting including an operation of supplying slurry containing the fluorescent material into the light-transmissive resin. Thus, the wavelength conversion layer can be easily formed at any position. Further, the thickness, shape and the like of the wavelength conversion layer can be easily controlled, whereby the light emitting device can be stably manufactured.

Note that, as compared to spraying or the like, potting can relatively reduce the stress applied to the fluorescent material during manufacture of the light emitting device. Accordingly, in the case where the fluorescent material contained in the wavelength conversion layer is low in energy absorption (being small in mechanical strength) also, the wavelength conversion layer can be surely formed at a proper portion without impairing its shape and characteristics.

In the case where the wavelength conversion layer is formed simultaneously with a light-transmissive material being a binder by potting or the like, preferably the wavelength conversion layer is formed so that the concentration of the fluorescent material becomes greater at the position closer to the light emitting element in the thickness direction of the wavelength conversion layer. To this end, the viscosity of the light-transmissive material is preferably adjusted taking into consideration of the particle size of the fluorescent material. Thus, the fluorescent material can be directly irradiated with most of light emitted from the light emitting element, whereby wavelength conversion efficiency improves and color non-uniformity and the like are prevented. Further, the increased distance between the fluorescent material and the surface of the light emitting device reduces the influence of the external environment (moisture, gas, ultraviolet rays, oxygen and the like) to the fluorescent material. Further, by placing the fluorescent material in close proximity to other member of the light emitting device such as the support substrate, the light shielding member, the light emitting element and the like, heat generated by the fluorescent material in wavelength conversion is efficiently dissipated.

Such a wavelength conversion layer can be formed by, for example, a method including operations of: potting the material of the wavelength conversion layer; and thereafter stationary placing the potted material until the fluorescent material settles, or applying centrifugal force to the potted material.

The first wavelength conversion layer is preferably smaller in concentration of the fluorescent material than the second wavelength conversion layer. This reduces absorption of primary light or secondary light by the first fluorescent material that is disposed at the position nearer to the light emitting element.

The thickness of the first wavelength conversion layer is, for example, preferably 200 μm or smaller, and more preferably 100 μm or smaller. The first wavelength conversion layer is preferably greater in thickness than the second wavelength conversion layer.

While the second wavelength conversion layer may be formed by any method, preferably the second wavelength conversion layer is formed by spraying on the first wavelength conversion layer. The spraying may be any of the dry scheme or the wet scheme.

Note that, the fluorescent material is not being specified to be contained in the wavelength conversion layer, and may be provided in various positions in the light emitting device or in members. For example, the fluorescent material may be formed as a fluorescent material layer that is applied or bonded to a light-transmissive member that contains no fluorescent material.

The wavelength conversion layer may further contain filler (e.g., a diffusing agent, a coloring agent or the like). For example, the filler may be a crystal or a sintered body of silica, titanium oxide, zirconium oxide, magnesium oxide, glass, a fluorescent material, or a sintered body of a mixture of a fluorescent material and an inorganic binder. Arbitrarily, the refractive index of the filler may be adjusted. For example, the refractive index of the filler may be 1.8 or greater.

The shape of the particles of the filler may be crushed, spherical, hollow, porous or the like. The average particle size (median size) of the particles is preferably in a range of about 0.08 μm to 10 μm with which the light scattering effect is achieved highly effectively. The fluorescent material and/or the filler may be contained by, for example, in a range of about 10 wt % to 80 wt % to the total weight of the light-transmissive member.

When spraying is employed as the method of forming the wavelength conversion layer, particularly the pulsed splaying scheme is preferable, in which spraying is performed in a pulsed manner, that is, intermittently. Spraying intermittently can reduce a fluorescent material injection amount per unit time. Accordingly, by the nozzle that sprays shifting at a low speed while spraying the material by a smaller injection amount, the material is applied uniformly to the applied surface having irregular shapes. Further, as compared to the continuous spraying scheme, the pulsed splaying scheme can reduce the air velocity without reducing the speed of slurry injected from the nozzle. Thus, slurry is supplied to the applied surface in an excellent manner, and the applied slurry is not disturbed by airflow. As a result, a coating film that exhibits high adhesion between the particles of the fluorescent material and the surface of the light emitting element is formed. Additionally, thin particle layers each containing a particulate fluorescent material can be formed in a plurality of numbers. Controlling the number of layers can improve the thickness precision thereof. Further, distribution of the fluorescent material becomes less prone to become uneven. Thus, light having undergone wavelength conversion uniformly is emitted, whereby color non-uniformity or the like of the light emitting element is avoided.

The thickness of the wavelength conversion layer is not particularly specified. For example, the thickness may be in a range of about 1 μm to 300 μm, about 1 μm to 100 μm, about 2 μm to 60 μm, or about 5 μm to 40 μm.

Particularly in backlight applications, the wavelength conversion layer having such a relatively small thickness further enhances the light emission efficiency of the light emitting element and the efficiency of the backlight. For example, as described above, light emission toward the light extraction surface increases, and efficiency of light entering into the backlight enhances. Further, the amount of the light-transmissive member in the wavelength conversion layer can be reduced. In the case where resin that exhibits relatively low thermal emissivity is used as the light-transmissive member, reducing the proportion of the resin can reduce heat accumulated by the fluorescent material. At the same time, the contact area between the light emitting element and the fluorescent material or between the fluorescent materials increases, whereby the heat transfer path can be reliably obtained. Hence, the heat dissipation property of the fluorescent material improves, whereby the light emission efficiency of the light emitting device improves. Further, since the light extraction surface of the light emitting device and a light entering portion of a light guide plate can be mounted in extremely close proximity to each other, light can enter the light guide plate of the backlight at higher luminance, improving the efficiency at the backlight.

The wavelength conversion layer may be provided with irregular shapes on its surface. While such irregular shapes may formed by any method, as described above, in the case where a plurality of particle layers including a particulate fluorescent material is layered, irregular shapes reflecting corresponding particle size of the fluorescent material are formed on the surface of the wavelength conversion layer. By such, manufacturing process of the light emitting device can be simplified.

The method of manufacturing a light emitting device of the present disclosure is applicable as a method of manufacturing a light emitting device as a backlight light source of a liquid crystal display, various illumination devices, a large display, various display devices such as an advertisement board or a destination board, an image reading device in a digital video camera, a facsimile, a copier, or a scanner, and a projector device.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, the method comprising, in sequence:
    mounting, on a support substrate, an element set that includes a plurality of light emitting elements on an element substrate;
    providing a light reflecting member between the element set and the support substrate;
    completely removing the element substrate from the plurality of light emitting elements; and
    cutting the support substrate and the light reflecting member between the plurality of light emitting elements so as to singulate a plurality of light emitting devices.

2. The method according to claim 1, wherein the element substrate is a substrate for growing the plurality of light emitting elements, and removed with laser lift-off.

3. The method according to claim 1, wherein the light reflecting member includes a thermosetting resin containing a light reflecting material.

4. The method according to claim 1, further comprising:
    providing a wavelength conversion layer that converts a wavelength of light emitted by the plurality of light emitting elements on an upper surface of the plurality of light emitting elements after the element substrate is removed.

5. The method according to claim 4, wherein the wavelength conversion layer is provided with spraying.

6. The method according to claim 4, wherein the wavelength conversion layer is provided with potting.

7. The method according to claim 1, wherein the light emitting device includes the plurality of light emitting elements by two or more pieces.

* * * * *